(12) United States Patent
Chang et al.

(10) Patent No.: US 7,594,748 B2
(45) Date of Patent: Sep. 29, 2009

(54) LED LIGHT STRUCTURE AND COMBINATION DEVICE THEREOF

(75) Inventors: Kun-Jung Chang, Kaohsiung County (TW); Chiang-Yuan Juan, Kaohsiung County (TW); Kuo-Chun Lin, Kaohsiung County (TW)

(73) Assignee: Li-Hong Technological Co., Ltd., Kaohsiung County (TW)

( * ) Notice: Subject to any disclaimer, the term of this patent is extended or adjusted under 35 U.S.C. 154(b) by 44 days.

(21) Appl. No.: 11/907,279

(22) Filed: Oct. 10, 2007

(65) Prior Publication Data

US 2009/0098342 A1 Apr. 16, 2009

(51) Int. Cl.
*H01R 33/00* (2006.01)
*F21V 21/00* (2006.01)
(52) U.S. Cl. ............. 362/650; 362/249.02; 362/249.11; 362/649
(58) Field of Classification Search .................. 362/649, 362/650, 294, 249, 800
See application file for complete search history.

(56) References Cited

U.S. PATENT DOCUMENTS 4,630,183 A * 12/1986 Fujita .......................... 362/311
2002/0176253 A1* 11/2002 Lee ............................. 362/249

* cited by examiner

*Primary Examiner*—John A Ward
(74) *Attorney, Agent, or Firm*—Muncy, Geissler, Olds & Lowe, PLLC

(57) ABSTRACT

An LED light structure with combination device has at least including plural LED lights and plural fixing bases, wherein the LED light having a protruding portion mounted at one side thereof and the protruding portion having a thread mounted thereon for fixing with the fixing base which is a metal base with high heat sinking efficiency, and the fixing base has a through trough with a thread mounted thereinside, which is matching to the thread on the protruding portion of the LED light, so as to screw with the protruding portion of the LED light in a tight matching. Here, the protruding portion of the LED light can be a T shaped track and the fixing base can correspondingly have a T shaped trough matching to the shape of the protruding portion of the LED light, so that the LED light and the fixing base can be tightly embedded together.

9 Claims, 18 Drawing Sheets

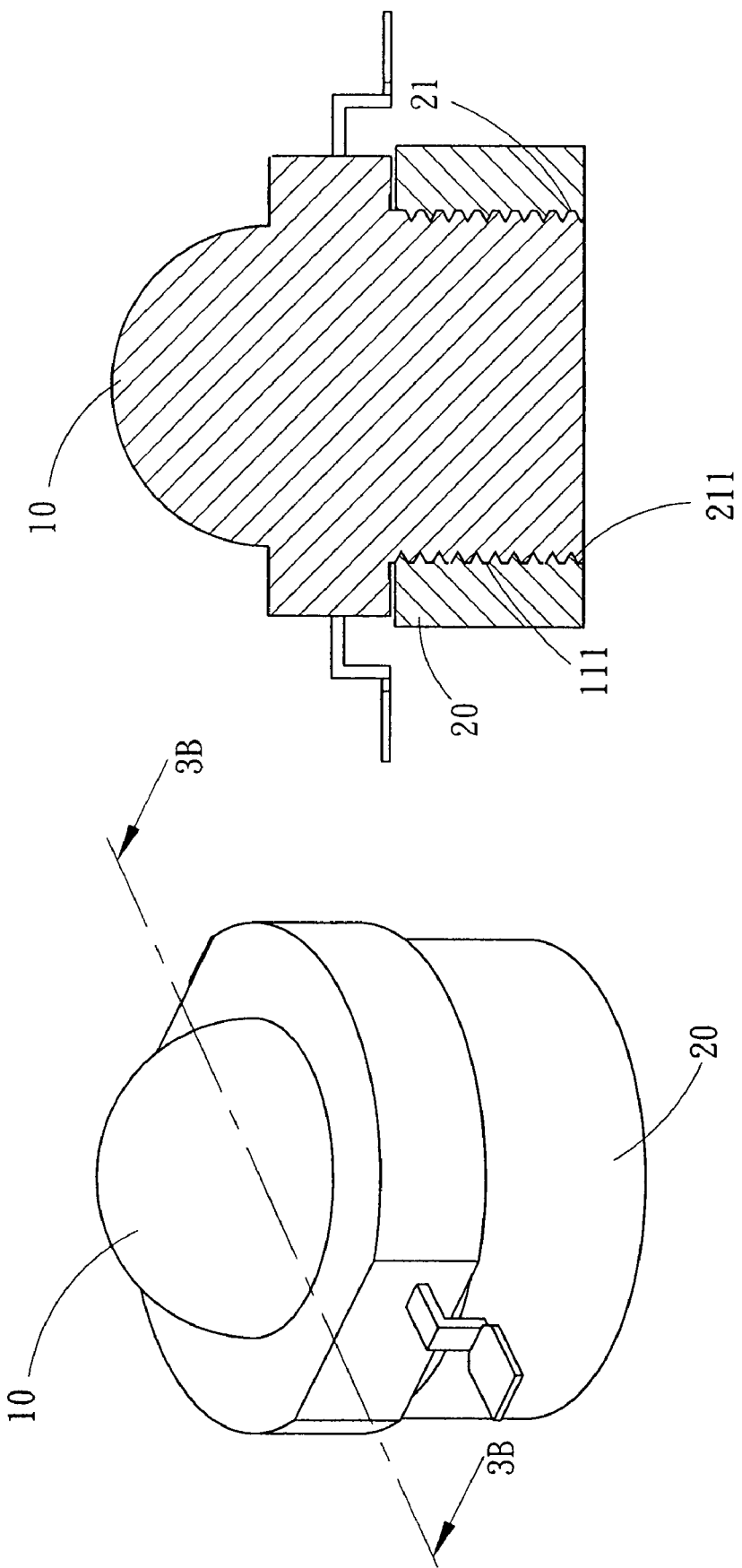

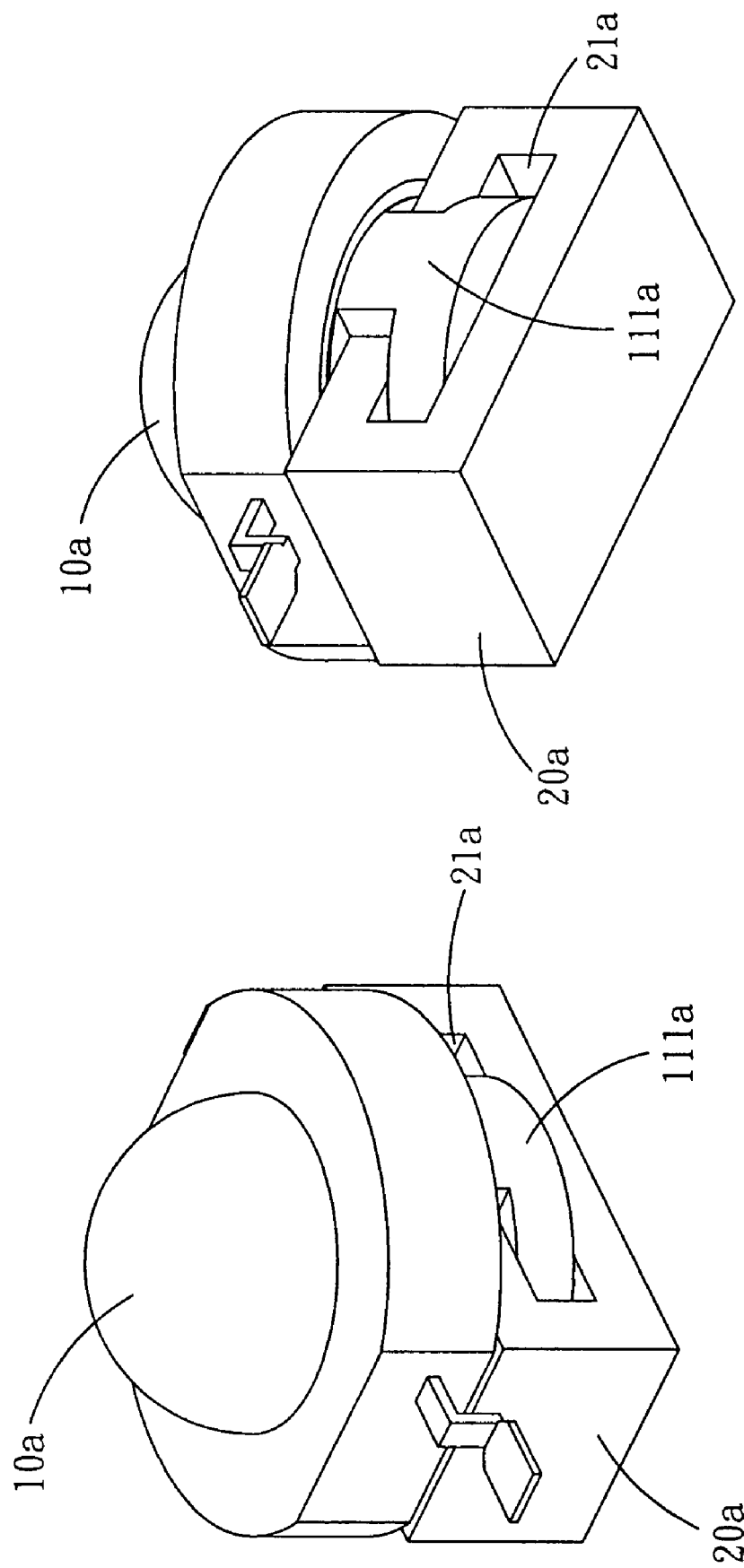

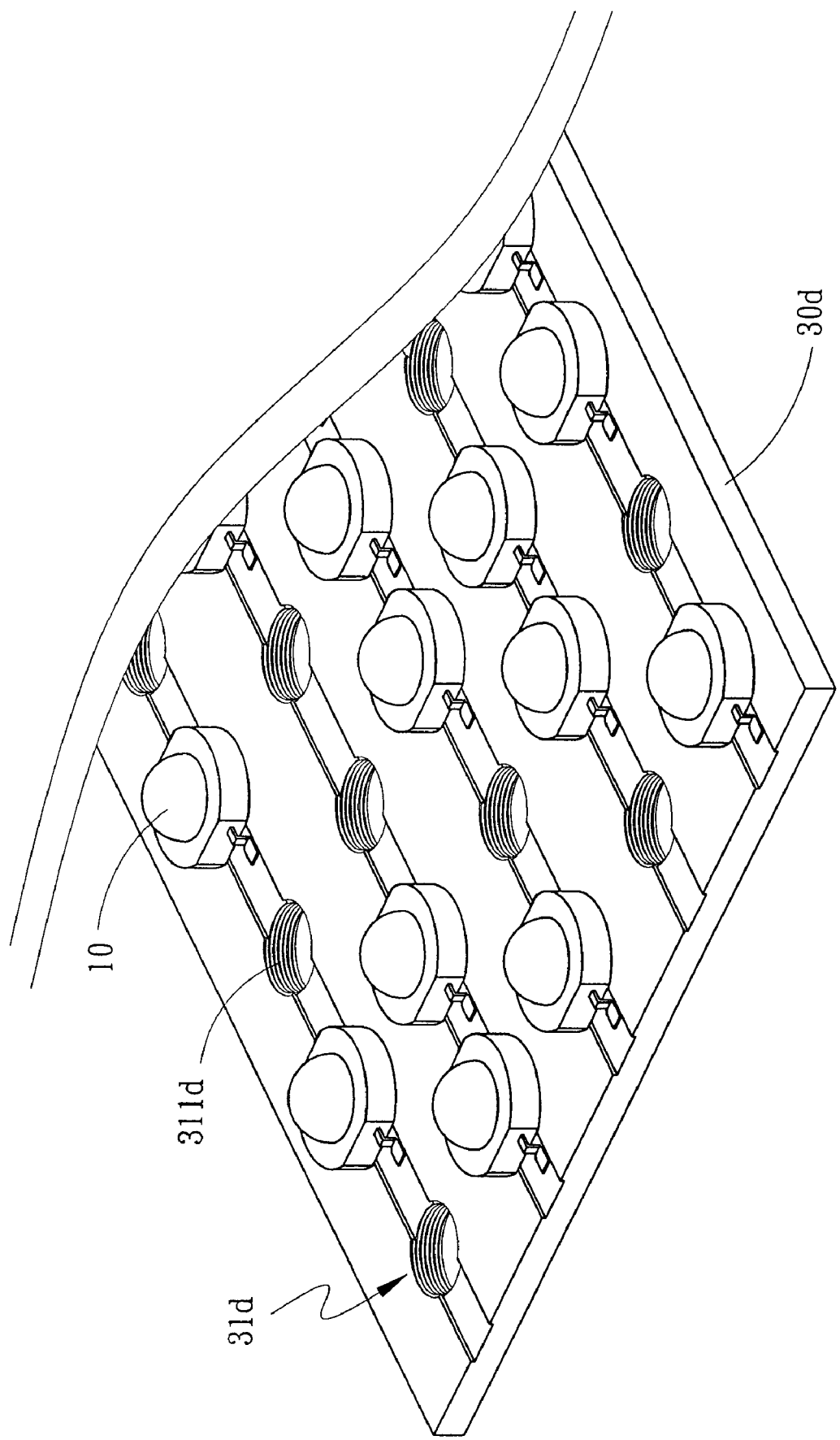

LED LIGHT STRUCTURE AND COMBINATION DEVICE THEREOF

FIELD OF THE INVENTION

The present invention is related to an LED light structure with combination device, and more particularly to an LED light which can be directly fixed on a base which can disperse the heat and combine with other heat dispersing body.

BACKGROUND OF THE INVENTION

Conventionally, when disposing LED, the LED is soldered on an aluminum substrate first, and then, the aluminum substrate is attached to a heat sink fin. However, this conventional method has the disadvantages that:

1. As heat dispersing, the heat of most conventional LEDs is dispersed through the aluminum substrate transmitting the heat to the heat sink fin, but the more the media used for transmitting the heat, the less the heat dispersed by the heat sink fin. This is because most heat is absorbed by the media passed by the heat and not dispersed.

2. The price of the aluminum substrate soldered by the conventional LED becomes higher and higher, which not only obviously will lift up the cost of the general heat sink device, but will also increase the consumer's loading.

SUMMARY OF THE INVENTION

The object of the present invention is to provide "an LED light structure and a combination device thereof" which is better than the conventional LED light and can be directly fixed and combined on a heat sinking base Another object of the present invention is to provide a fixing base combinable with the LED light which can directly combine with a LED light having a corresponding combination structure.

For achieving the objects described above, the present invention provides an LED light structure with combination device including plural LED lights and plural fixing bases, wherein the LED light has a protruding portion mounted at one side thereof and the protruding portion has a thread mounted thereon for fixing with the fixing base. The fixing base is a metal base with high heat sinking efficiency, and the fixing base has a through trough with a thread mounted thereinside, which is matching to the thread on the protruding portion of the LED light, so as to screw with the protruding portion of the LED light in a tight matching. Here, the protruding portion of the LED light can be a T shaped track and the fixing base can correspondingly have a T shaped trough matching to the shape of the protruding portion of the LED light, so that the LED light and the fixing base can be tightly embedded together.

Through the LED structure and the combination device thereof according to the present invention, the efficacies which can be achieved are:

1. Direct combination: The LED light with combination device of the present invention includes a protruding portion mounted at one side of the LED light and a through trough, having a shape corresponding to the protruding portion of the LED light, mounted on the metal fixing base with high heat sinking efficiency, so as to directly combine the LED light with the fixing base with other media, such as soldering material, screw. Therefore, the combination can be achieved easily through the simple structure.

2. Effectively reduced the media between heat radiator and heat sinker: In the present invention, the LED light is directly combined with the fixing base and the fixing base is a metal base with high heat sinking efficiency, so that the heat generated by the LED light can be completely dispersed through the fixing base, thereby effectively reducing the media between the heat radiator and the heat sinker. This not only simplifies the structure, but also reduces the manufacturing cost.

BRIEF DESCRIPTION OF THE DRAWINGS

The foregoing aspects and many of the attendant advantages of this invention will be more readily appreciated as the same becomes better understood by reference to the following detailed description, when taken in conjunction with the accompanying drawings, wherein:

FIG. 3A is a three-dimensional view of the present invention;

FIG. 3B is a sectional view of 3A-3B in FIG. 3A;

FIG. 6 is a decomposition drawing showing a further embodiment of the present invention;

FIG. 7 is another decomposition drawing showing a further embodiment of the present invention;

FIG. 21B is a partial magnification showing the combination with an aluminum substrate according to the present invention.

DESCRIPTION OF THE PREFERRED EMBODIMENT

Figure 2:
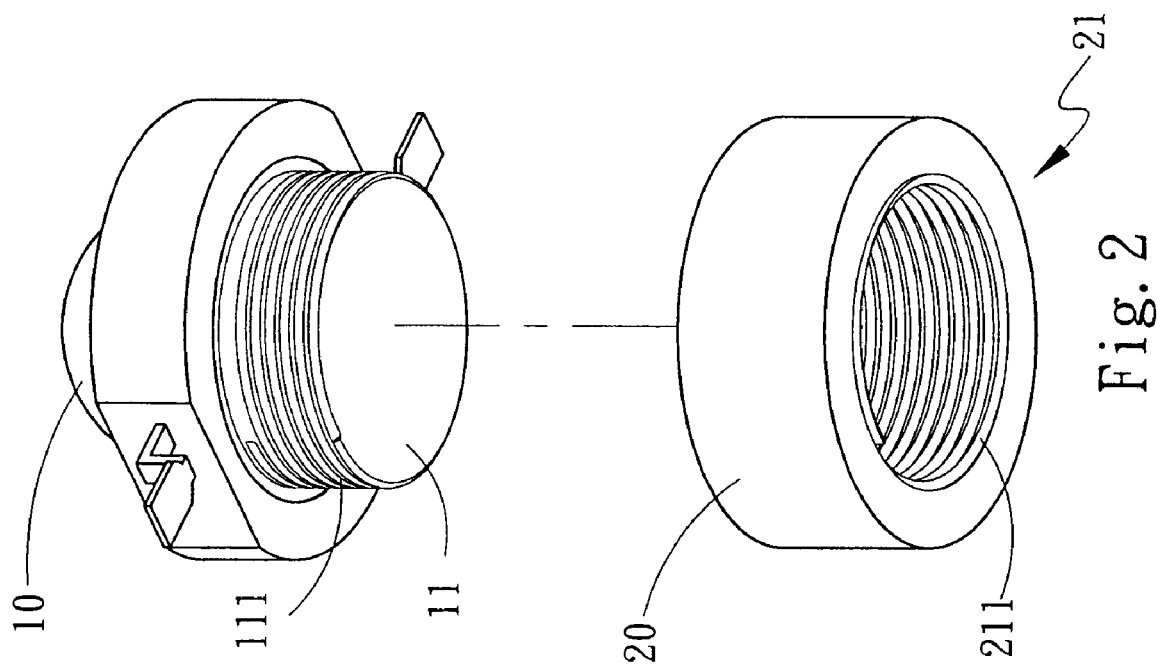
FIG. 2 is another decomposition drawing of the present invention.
Figure 1:
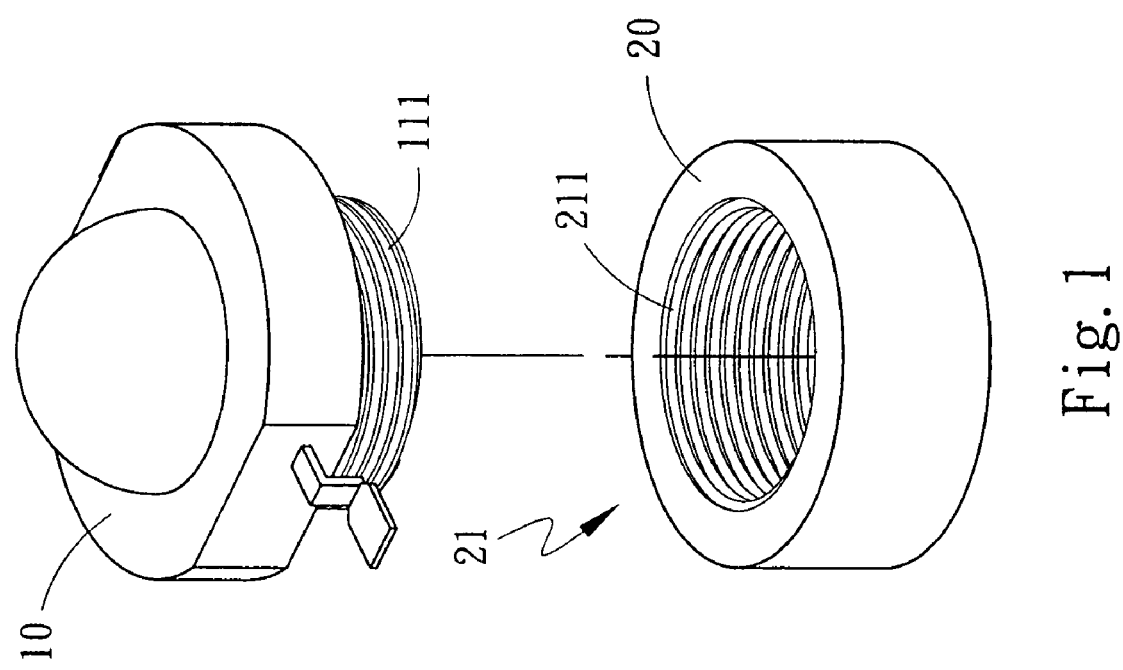
FIG. 1 is a decomposition drawing of the present invention.
Figure 3D:
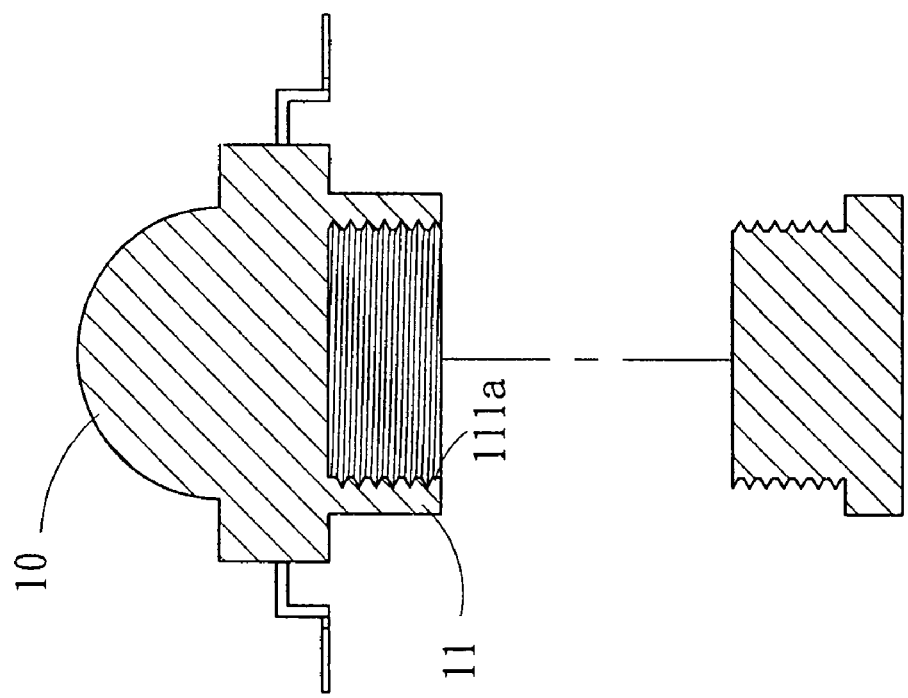
FIG. 3D is a sectional view showing a protruding portion of a LED light in another embodiment of the present invention.
Figure 3C:
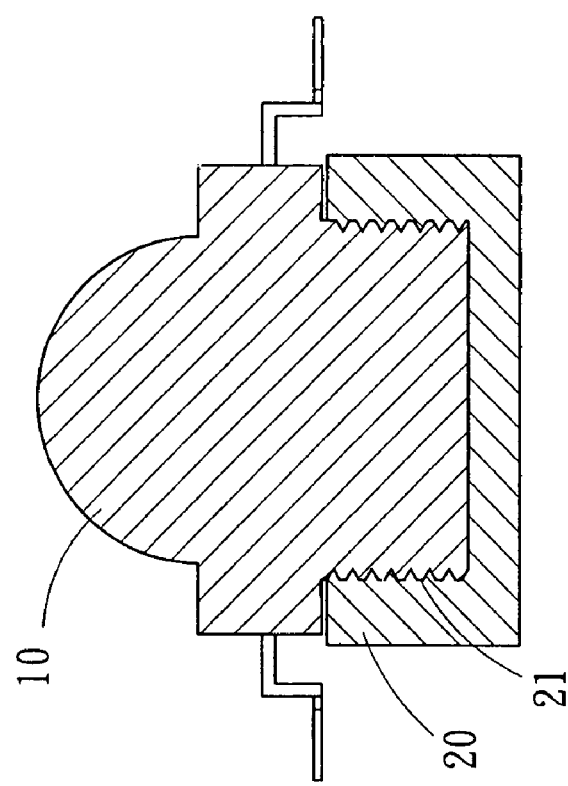
FIG. 3C is a sectional view showing a through trough of a fixing base in another embodiment of the present invention.
Figure 5:
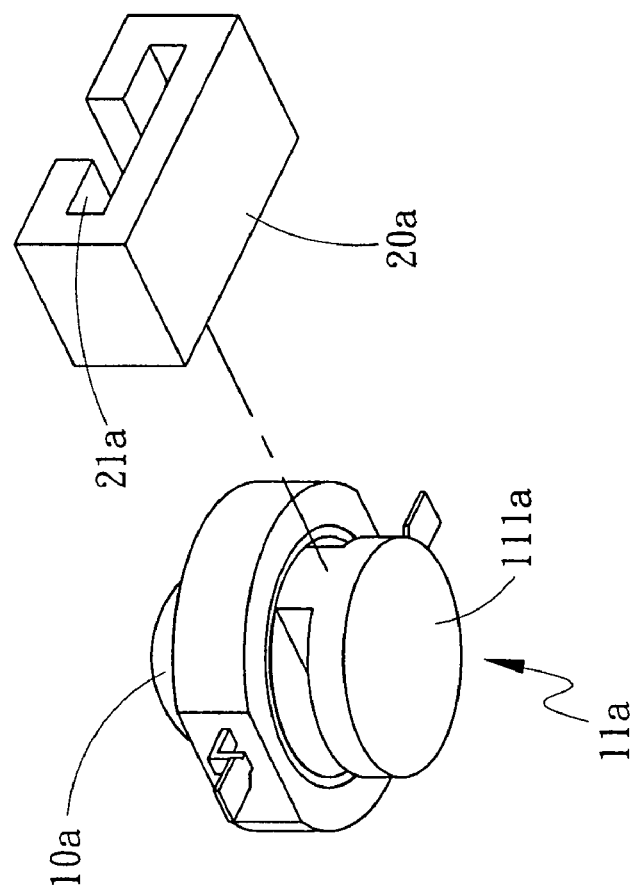
FIG. 5 is another decomposition drawing showing another embodiment of the present invention.
Figure 4:
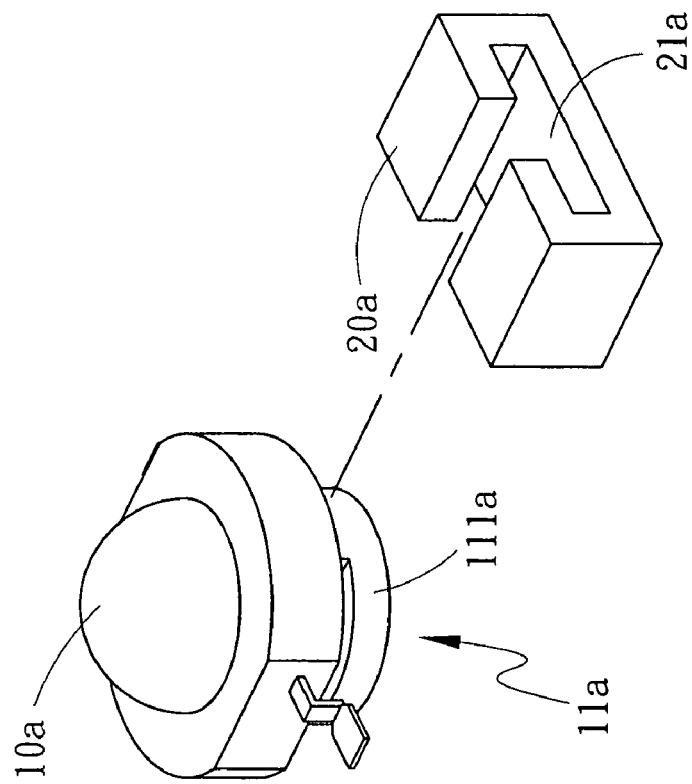
FIG. 4 is a decomposition drawing showing another embodiment of the present invention.

Please refer to FIGS. 1, 2, 3A and 3B. A LED light structure with a combination device at least includes plural LED lights 10 and plural fixing bases 20. The LED light 10 has a protruding portion 11 mounted at one side thereof, and the protruding portion 11 has a thread 111 mounted thereon for fixing with the fixing base 20. The fixing base 20 is a metal base with high heat sinking efficiency, and the fixing base 20 has a through trough 21 with a thread 211, which matches to the thread 111 on the protruding portion 11 of the LED light 10. According to different demands, the through trough 21 of the fixing base 20 also can be implemented as a blind hole, as shown in FIG. 3C, and the fixing base 20 also can be made of other metals with high heat sinking efficiency, such as copper, aluminum. Besides, as shown in FIG. 3D, the thread 11a on the protruding portion 11 of the LED light 10 also can be implemented as internal thread, and correspondingly, the through trough 21 of the fixing base 20 can be implemented as external thread, which can be matched to the thread inside the protruding portion 11.

Figure 12:
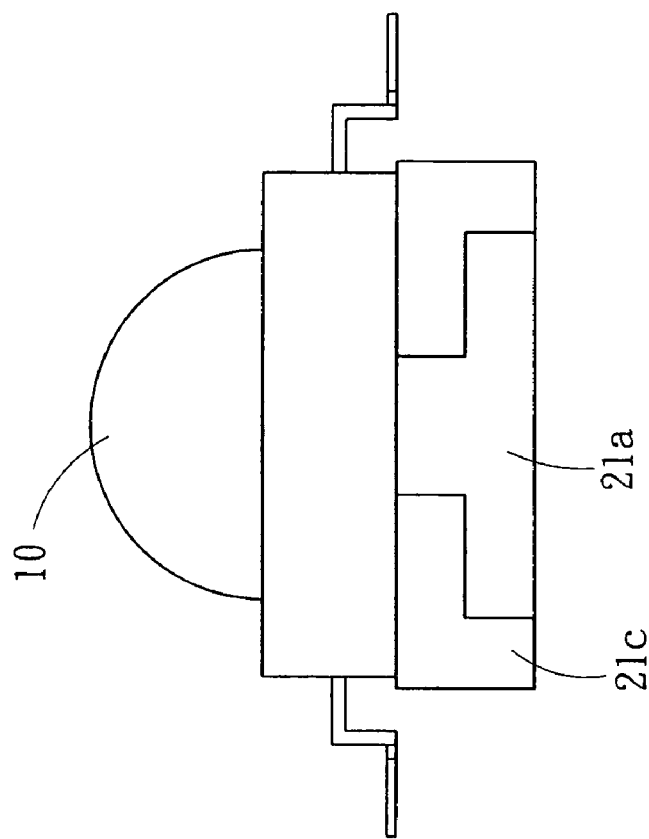
FIG. 12 shows the fixing base in another further embodiment of the present invention.
Figure 11:
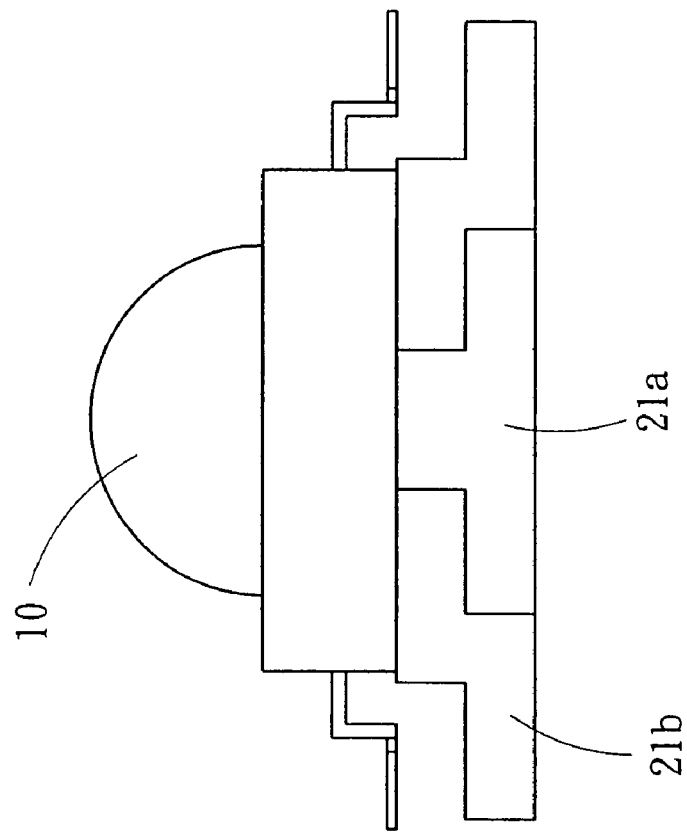
FIG. 11 shows the fixing base in another embodiment of the present invention.
Figure 13:
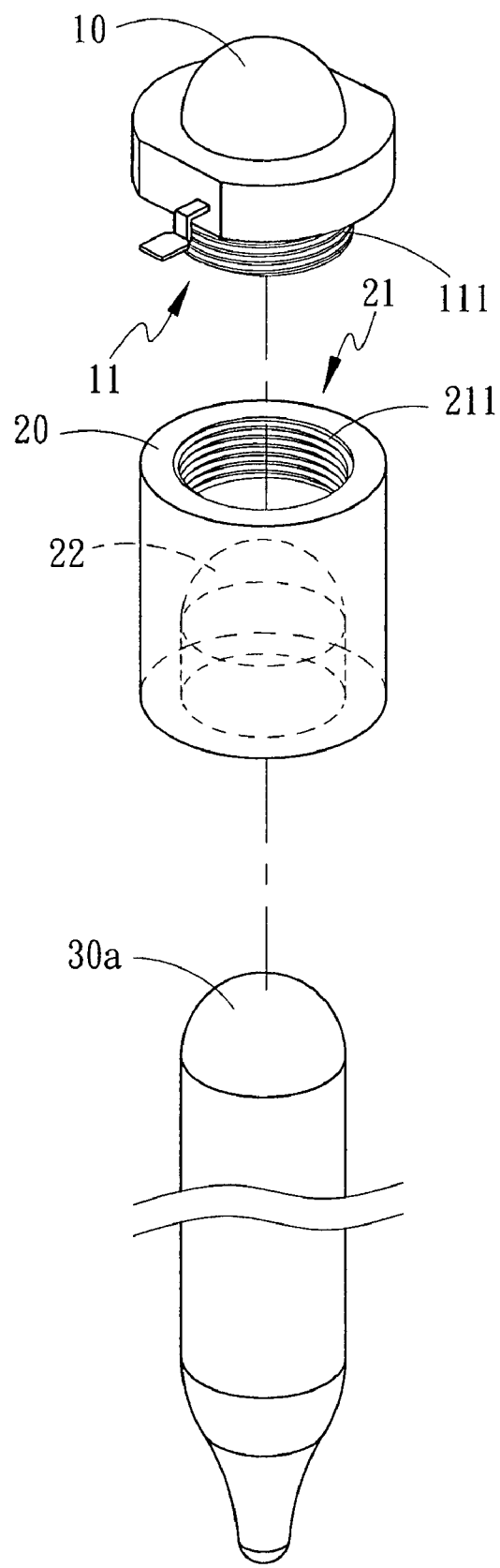
FIG. 13 is a decomposition drawing showing the combination of an independent heat sinking conductor with the present invention.
Figure 14:
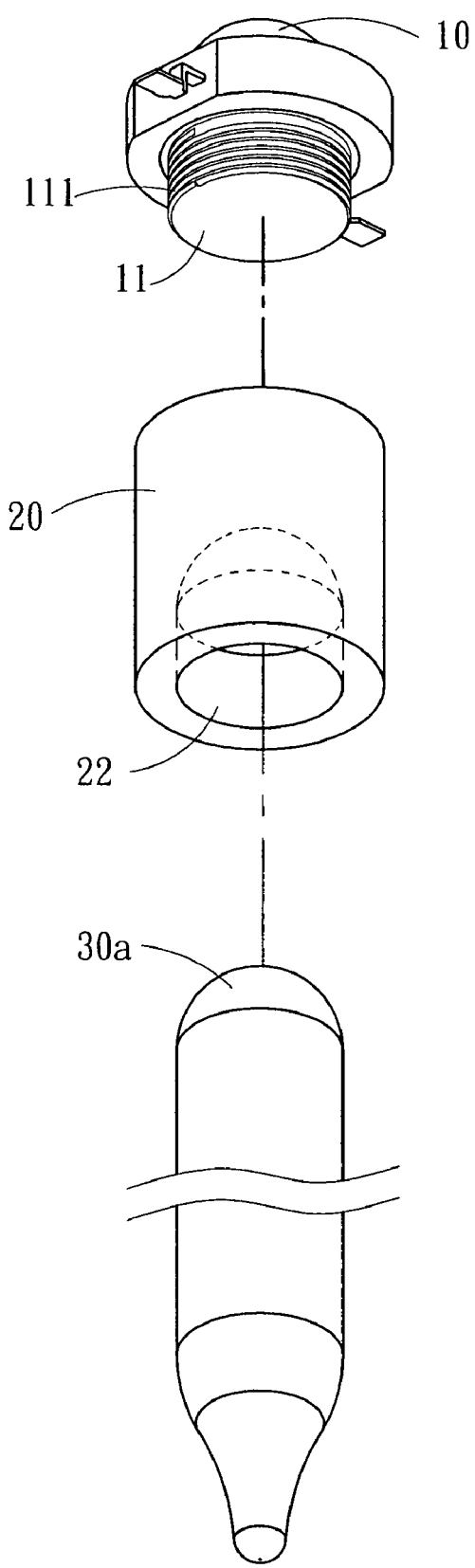
FIG. 14 is a decomposition drawing showing another kind of combination of the independent heat sinking conductor with the present invention.
Figure 15B:
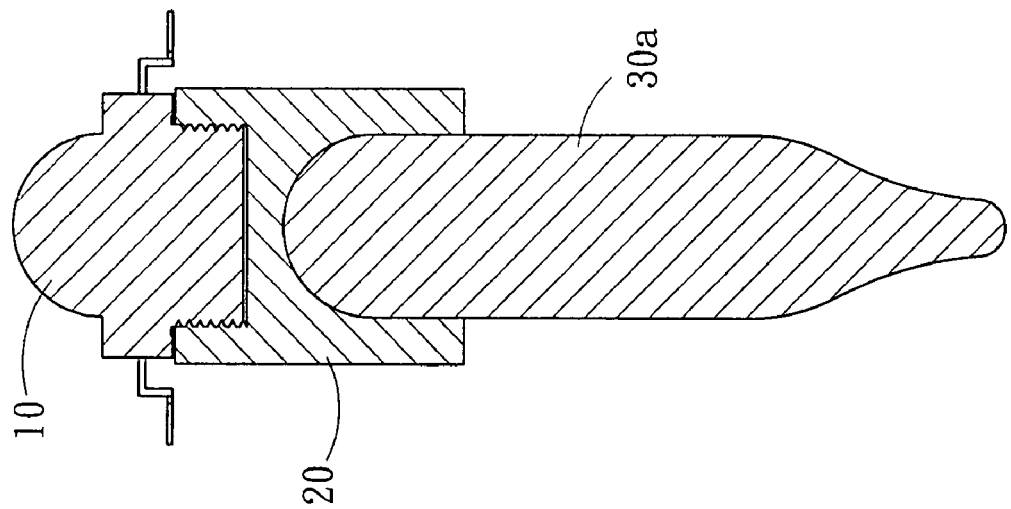
FIG. 15B is a sectional view of 15A-15B in FIG. 15A.
Figure 15A:
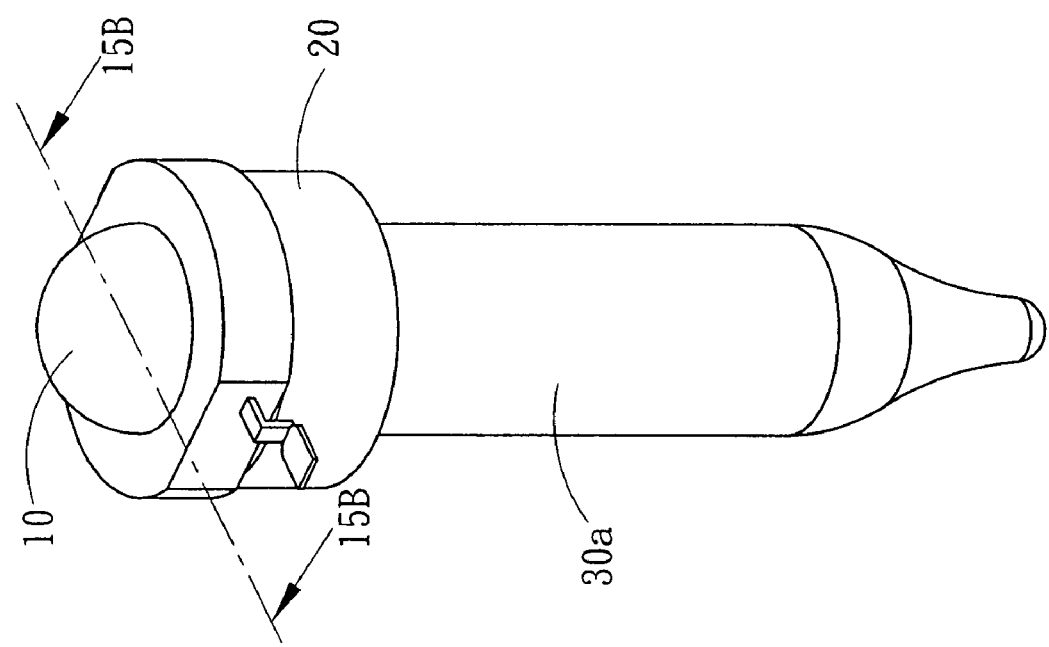
FIG. 15A is a three-dimensional combination drawing showing the combination of the independent heat sinking conductor with the present invention.
Figure 16:
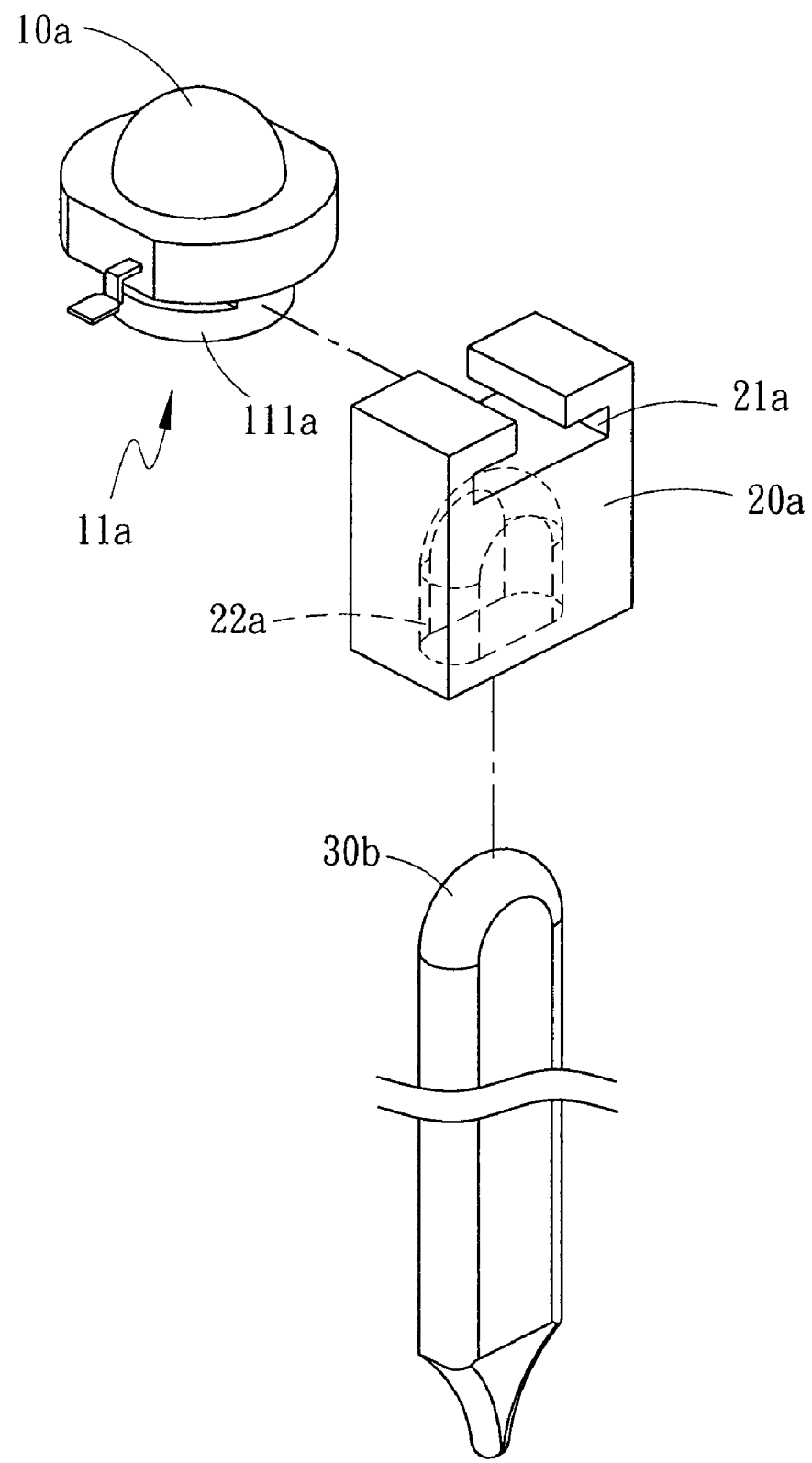
FIG. 16 is a decomposition drawing showing the combination with an independent heat sinking conductor in another embodiment of the present invention.
Figure 17:
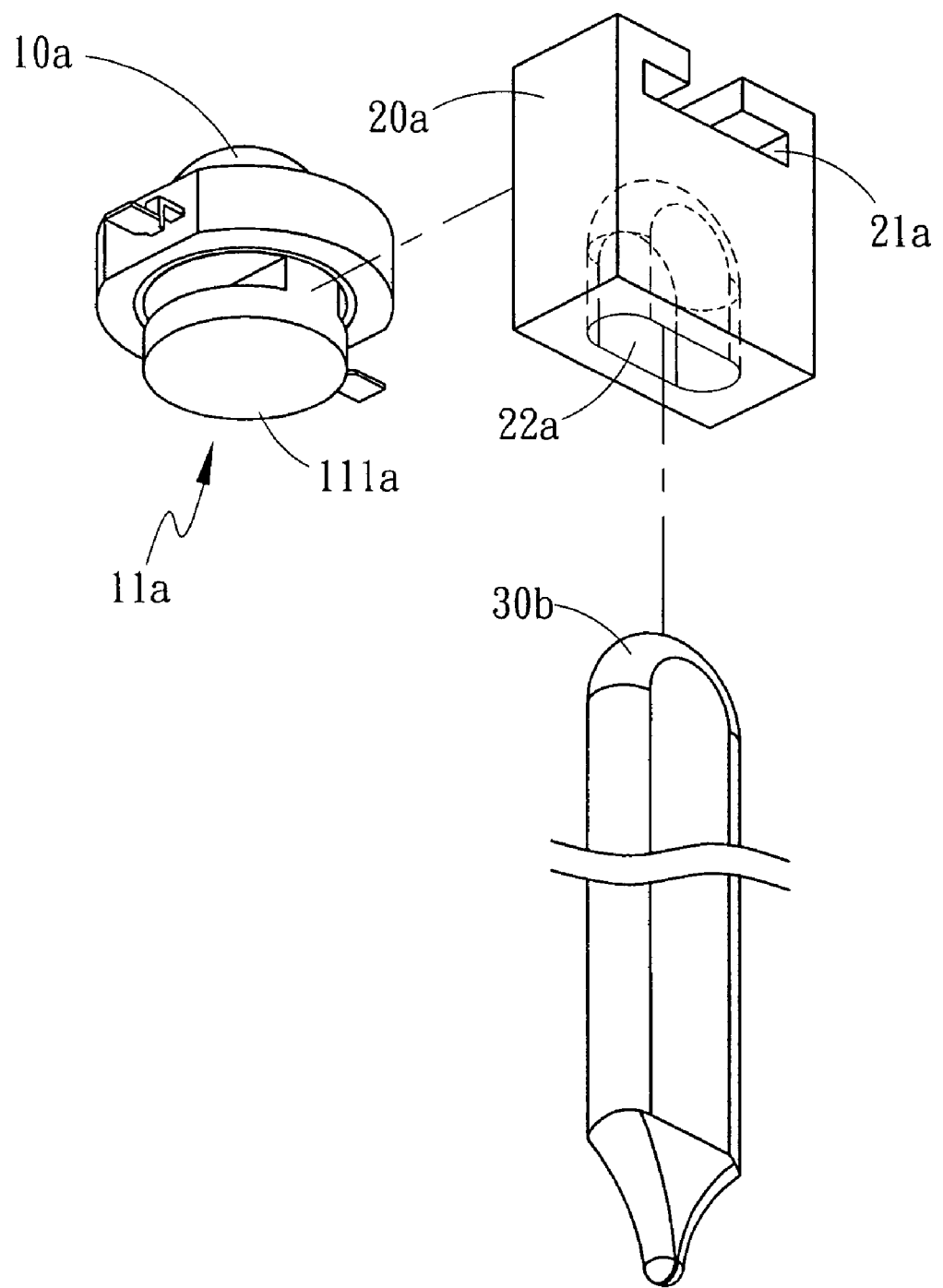
FIG. 17 is another decomposition drawing showing the combination with an independent heat sinking conductor in another embodiment of the present invention.
Figure 18:
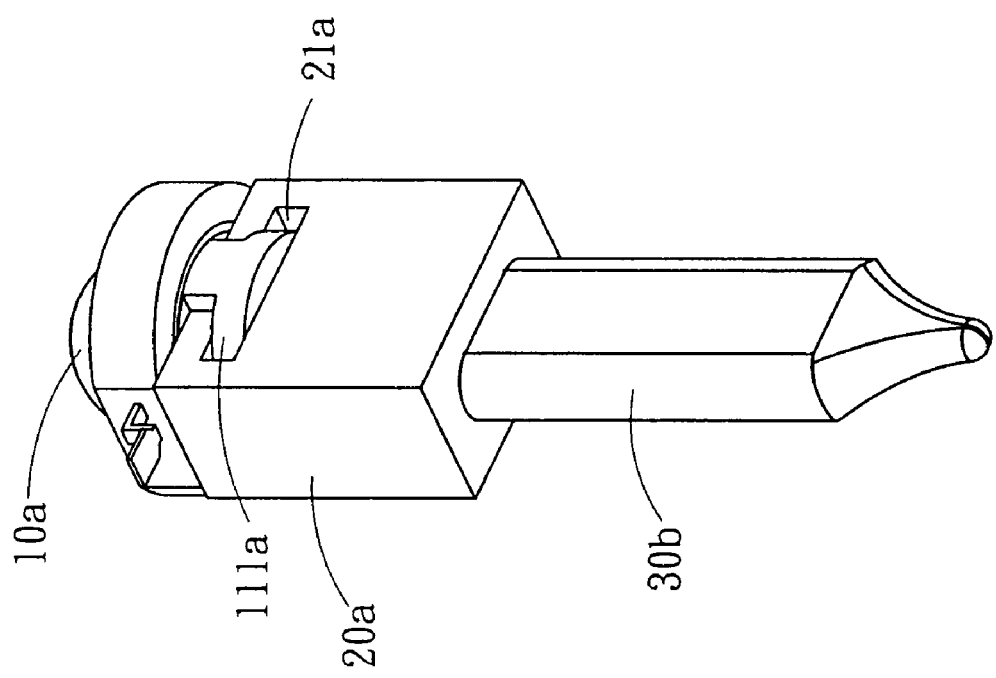
FIG. 18 is a three-dimensional combination drawing showing the combination with an independent heat sinking conductor in another embodiment of the present invention.

Please refer to FIGS. 4, 5, 6 and 7 which show an LED light with combination device in another embodiment. The protruding portion 11a of the LED light 10a is implemented as other engaging structure, such as T shaped track, and the through trough 21a of the fixing base 20a can be implemented to have a shape corresponding thereto, such as T shaped trough, so that the LED light 10a and the fixing base 20 can be tightly embedded together. Besides, as shown in FIGS. 11 and 12, the through trough 21a of the fixing base 20a also can be implemented as a symmetrical set of through troughs 21b, 21c for engaging the T shaped track.

Figure 8:
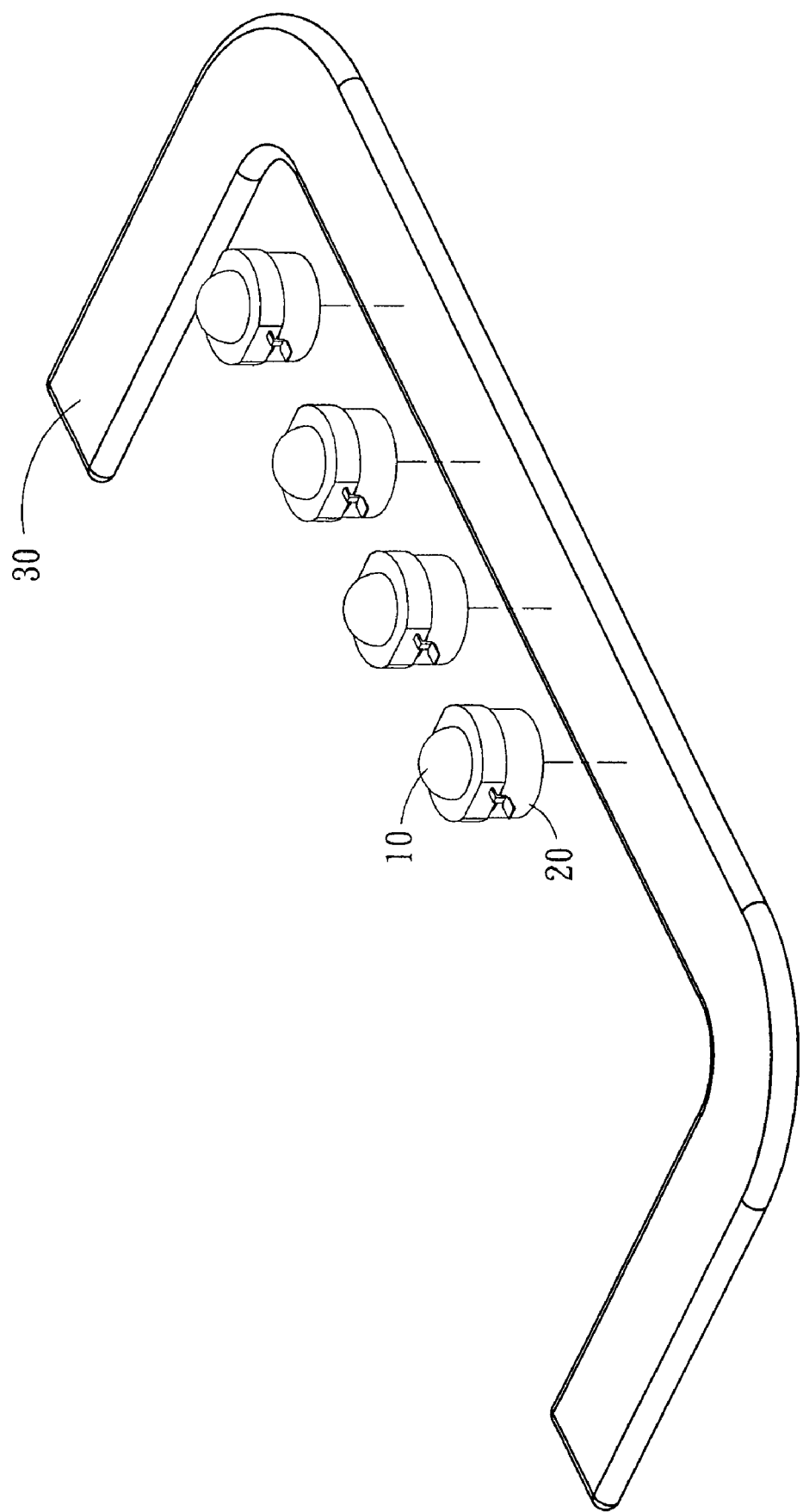
FIG. 8 is a three-dimensional decomposition drawing showing the usage of the present invention.
Figure 9:
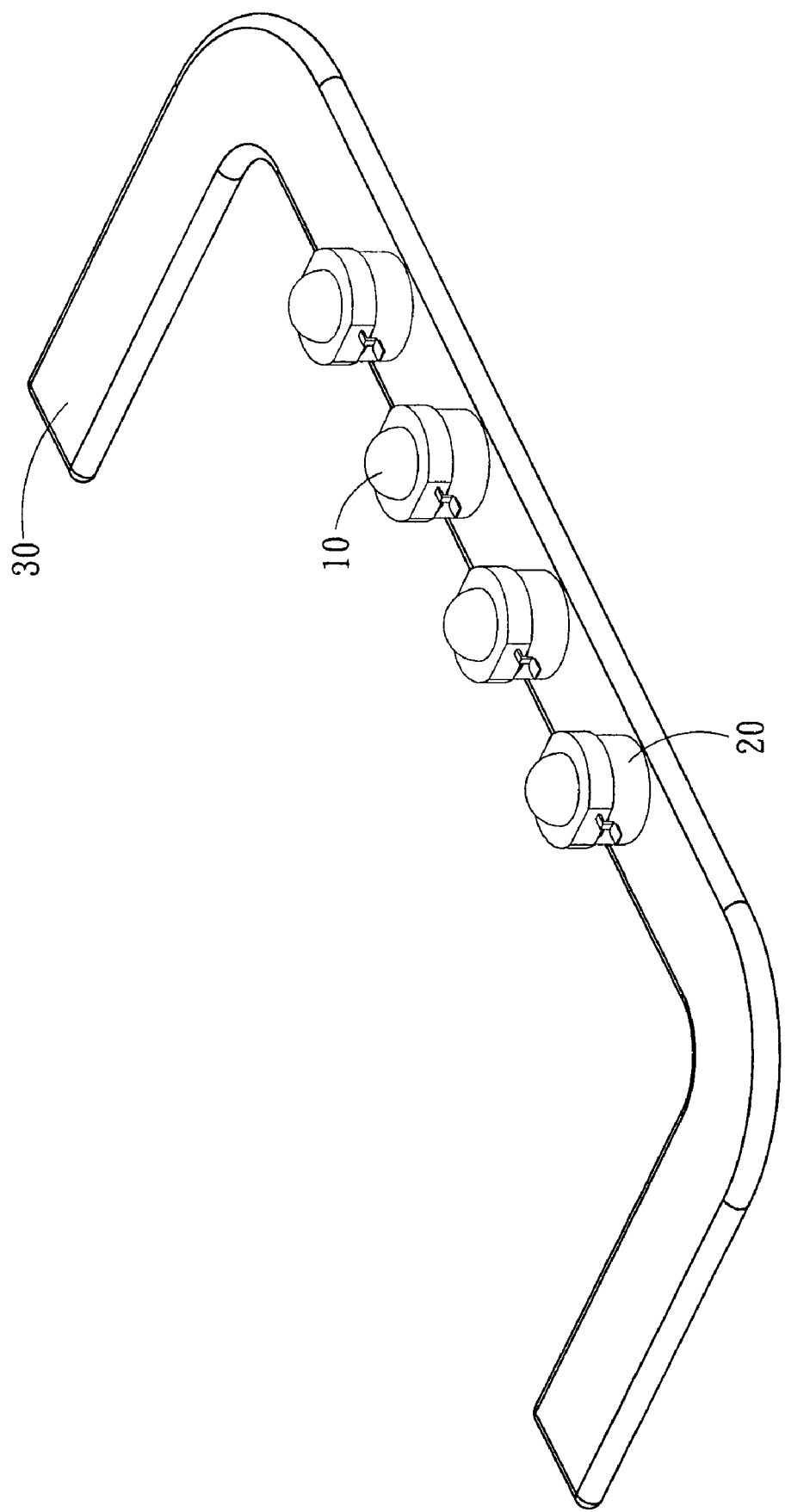
FIG. 9 is a three-dimensional combination drawing showing the usage of the present invention.
Figure 10:
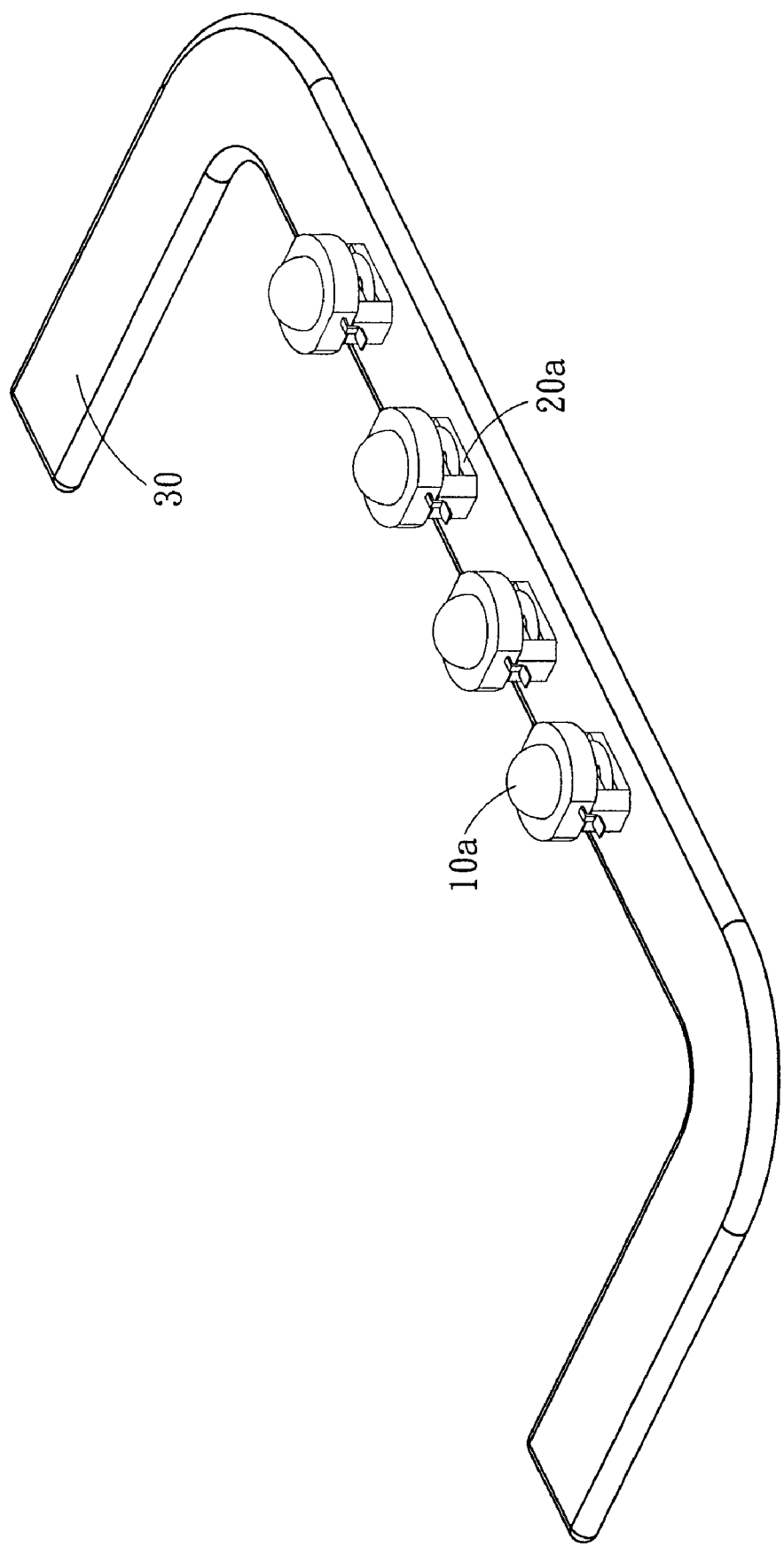
FIG. 10 is a three-dimensional combination drawing showing the usage of another embodiment in the present invention.
Figure 19A:
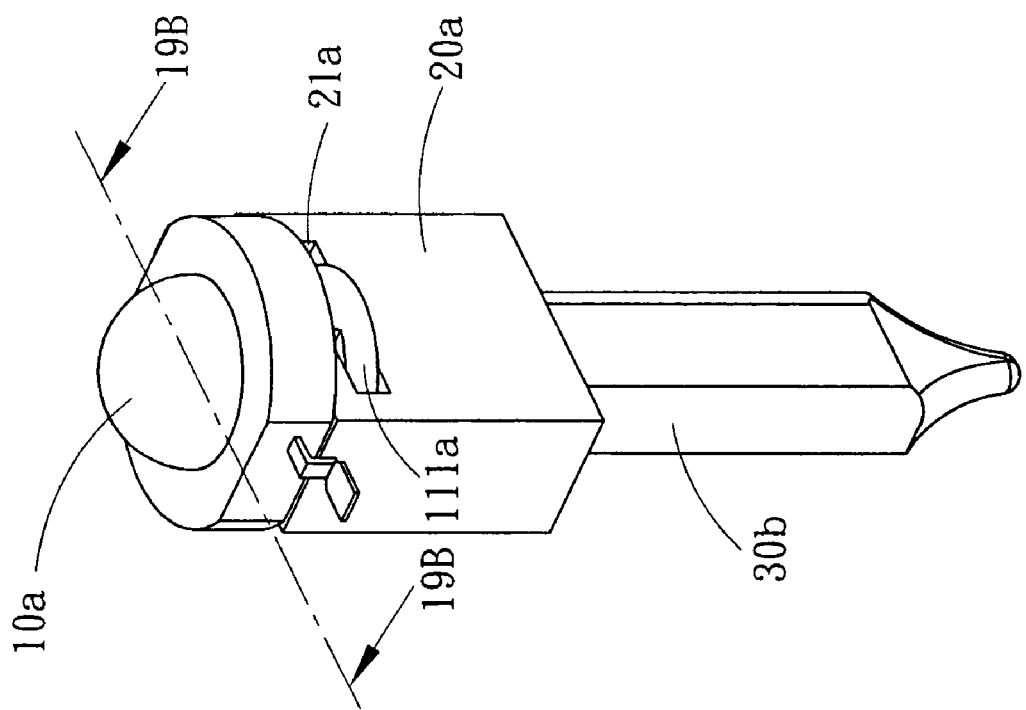
FIG. 19A is another three-dimensional combination drawing showing the combination with an independent heat sinking conductor in another embodiment of the present invention.
Figure 19D:
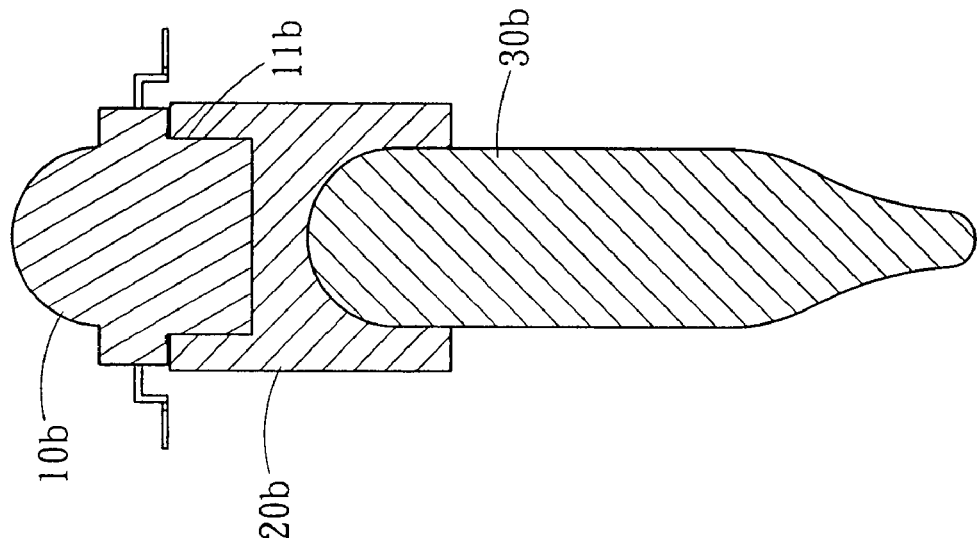
FIG. 19D is a sectional view showing the direct embedding between the LED light and the fixing base according to the present invention.
Figure 19C:
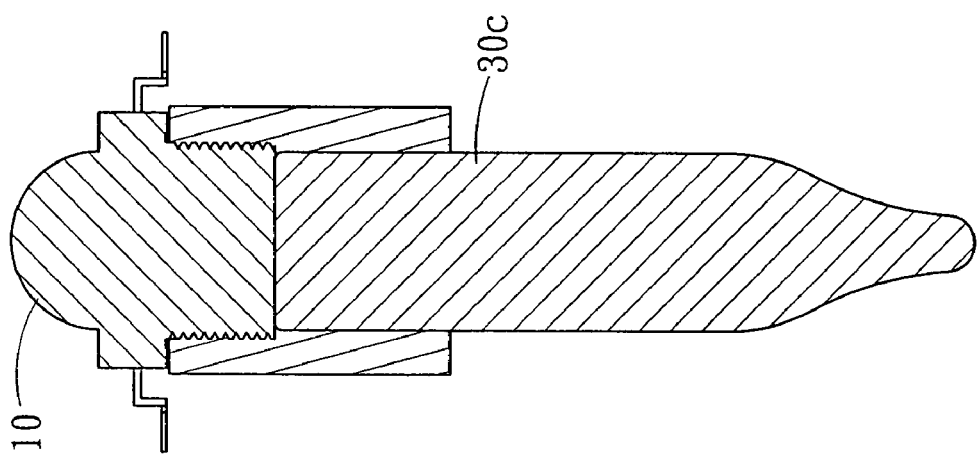
FIG. 19C is a sectional view showing the combination with the independent heat sinking conductor in another embodiment of the present invention.
Figure 19B:
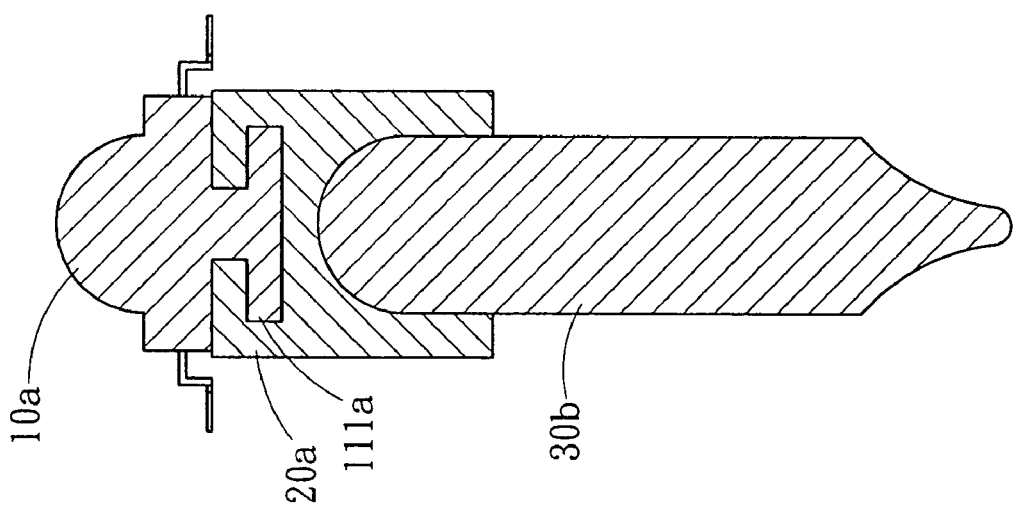
FIG. 19B is a sectional view of 19A-19B in FIG. 19A.
Figure 20:
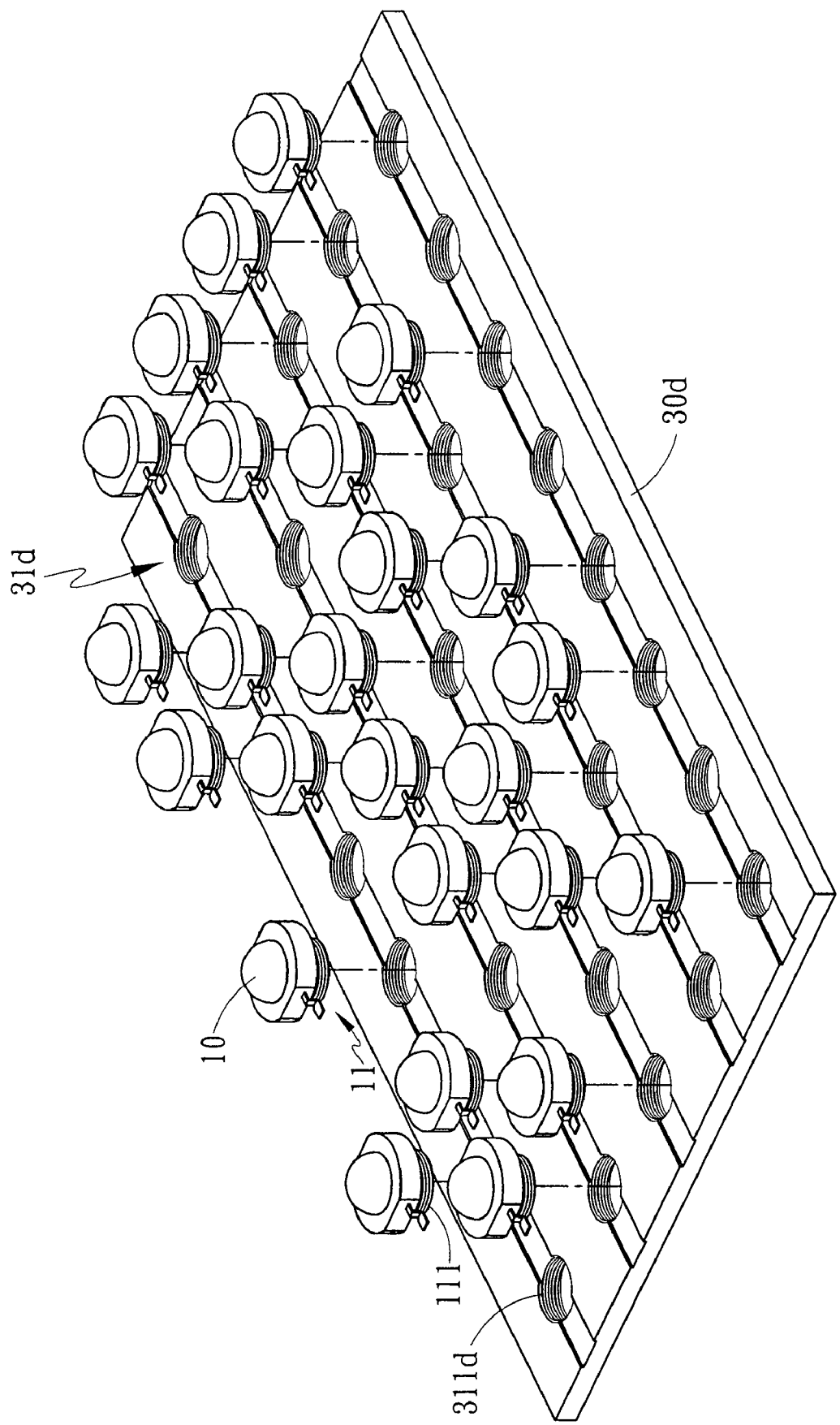
FIG. 20 is a three-dimensional decomposition drawing showing the combination with an aluminum substrate according to the present invention.
Figure 21A:
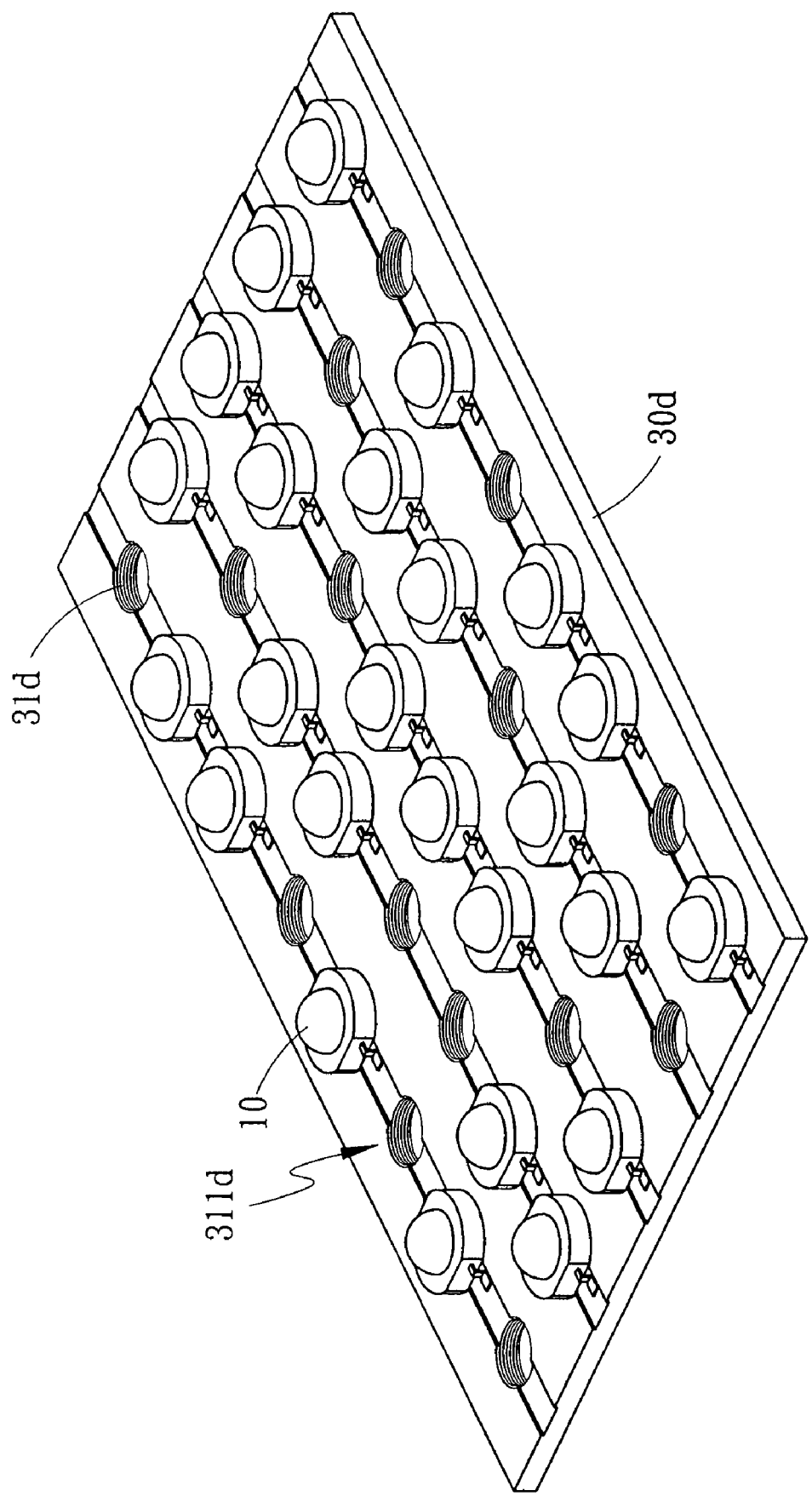
FIG. 21A is a three-dimensional combination view showing the combination with an aluminum substrate according to the present invention.

Please refer to FIGS. 8, 9 and 10. When using, the LED light with combination device can directly combine the LED light 10, 10a and the fixing base 20, 20a, and then, the combination is fixed on an independent heat sinking conductor 30. Also, the fixing base 20, 20a can have embedding trough 22, 22a at one side thereof for embedding independent heat conductor 30a, 30b, so as to combine the fixing base 20, 20a with the independent heat conductor 30a, 30b, as shown in FIGS. 13, 14, 15A, 15B, 16, 17, 18 and 19A. Identically, the protruding portion 11b of the LED light 10B also can be directly embedded in the fixing base 20b at the other side, so as to form a tight matching and fixation, as shown in FIG. 19D. When the independent heat conductor 30a, 30b is embedded into the embedding trough 22, 22a of the fixing base 20, 20a to achieve the engagement therebetween, the combination can be fixed on other device by general connecting method, such as soldering. If one end of the independent heat sinking conductor 30c is implemented as a flat surface, the independent heat sinking conductor 30c can directly contact with the LED light 10, as shown in FIGS. 19B and 19C. This design improves the heat sinking efficiency of the LED light 10, 10a, so that the variety of usage can be achieved. The independent heat sinking conductor 30, 30a, 30b 30c can be implemented as heat sinking device, such as heat pipe or flat heat pipe, with heat sinking efficacy, or the independent heat conductor 30d can be implemented as aluminum substrate with plural through holes 31d, which respectively have internal thread 311d, so that the LED light 10 can be connected with the aluminum substrate by screwing, as shown in FIGS. 20, 21A and 21B. Besides, the method for fixing the independent heat sinking conductor 30, 30a, 30b, 30c with the fixing base 20, 20a also can be implemented as tight matching.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An LED light structure with combination device comprising plural LED lights and plural fixing bases, each LED light having a protruding portion mounted at one side thereof and the protruding portion having a thread mounted thereon for fixing with a corresponding fixing base, wherein:

the fixing base is a metal base with high heat sinking efficiency, and the fixing base has a through trough with a thread mounted thereinside, which is matching to the thread on the protruding portion of the LED light, so as to screw with the protruding portion of the LED light in a tight matching.

2. The LED light structure with combination device as claimed in claim 1, wherein the through trough of the fixing base is a T shaped trough.

3. The LED light structure with combination device as claimed in claim 1, wherein the shape of the through trough of the fixing base is matching to that of the protruding portion of the LED light.

4. The LED light structure with combination device as claimed in claim 1, wherein the fixing base is made of copper.

5. The LED light structure with combination device as claimed in claim 1, wherein the fixing base has an embedding trough mounted at one side thereof for embedding an independent heat sinking conductor.

6. The LED light structure with combination device as claimed in claim 5, wherein the independent heat sinking conductor is a heat sinking device with heat sinking efficacy.

7. The LED light structure with combination device as claimed in claim 5, wherein the independent heat sinking conductor is a heat pipe.

8. The LED light structure with combination device as claimed in claim 5, wherein the independent heat sinking conductor is a flat heat pipe.

9. The LED light structure with combination device as claimed in claim 5, wherein the independent heat sinking conductor is an aluminum substrate.

* * * * *